United States Patent
Sippel et al.

(10) Patent No.: US 9,536,680 B2
(45) Date of Patent: Jan. 3, 2017

(54) ELECTRICAL SWITCHING APPARATUS, AND JUMPER AND ASSOCIATED METHOD THEREFOR

(71) Applicant: EATON CORPORATION, Cleveland, OH (US)

(72) Inventors: Kevin Lee Sippel, Moon Township, PA (US); Kenneth Martin Fischer, Finleyville, PA (US)

(73) Assignee: EATON CORPORATION, Cleveland, OH (US)

( * ) Notice: Subject to any disclaimer, the term of this patent is extended or adjusted under 35 U.S.C. 154(b) by 202 days.

(21) Appl. No.: 14/308,169

(22) Filed: Jun. 18, 2014

(65) Prior Publication Data
US 2015/0371790 A1 Dec. 24, 2015

(51) Int. Cl.
| | | |
|---|---|---|
| *H01H 1/62* | (2006.01) | |
| *H01H 1/58* | (2006.01) | |
| *H01H 11/04* | (2006.01) | |
| *F28F 13/00* | (2006.01) | |
| *H05K 7/20* | (2006.01) | |
| *H01H 9/52* | (2006.01) | |

(Continued)

(52) U.S. Cl.
CPC ............ *H01H 1/62* (2013.01); *F28F 13/00* (2013.01); *H01H 1/58* (2013.01); *H01H 9/52* (2013.01); *H01H 11/04* (2013.01); *H01H 71/082* (2013.01); *H01H 71/1045* (2013.01); *H05K 7/2039* (2013.01); *H01H 2033/6613* (2013.01); *H01H 2207/018* (2013.01); *H01H 2239/072* (2013.01); *Y10T 29/49206* (2015.01); *Y10T 29/49226* (2015.01)

(58) Field of Classification Search
CPC .... H01H 1/62; H01H 71/082; H01H 71/1045; H01H 2033/6613
See application file for complete search history.

(56) References Cited

U.S. PATENT DOCUMENTS

| | | | | |
|---|---|---|---|---|
| 3,171,069 A | * | 2/1965 | Koltuniak | ............ H01L 23/367 165/133 |
| 3,513,908 A | * | 5/1970 | Singh | ...................... F28D 7/024 138/38 |

(Continued)

FOREIGN PATENT DOCUMENTS

| | | |
|---|---|---|
| CN | 201 910 333 U | 7/2011 |
| CN | 203 038 822 U | 7/2013 |
| EP | 2 645 487 A1 | 10/2013 |

OTHER PUBLICATIONS

European Patent Office, "International Search Report and Written Opinion for PCT/US2015/025505", Jun. 29, 2015, 9 pp.

*Primary Examiner* — James Harvey
(74) *Attorney, Agent, or Firm* — Eckert Seamans; John Powers; Grant Coffield (57) ABSTRACT

A jumper is for an electrical switching apparatus having a plurality of poles. Each of the poles comprises a terminal. The terminal of a first one of the poles is proximate the terminal of a second one of the poles. The jumper includes a jumper member having an attachment portion and a heat sink portion. The attachment portion is structured to electrically connect the terminal of the first one of the poles to the terminal of the second one of the poles. The heat sink portion includes a plurality of spaced apart heat transfer members that are arranged in a plurality of rows and a plurality of columns.

18 Claims, 7 Drawing Sheets

(51) Int. Cl.
  *H01H 71/08* (2006.01)
  *H01H 71/10* (2006.01)
  *H01H 33/66* (2006.01)

(56) References Cited

U.S. PATENT DOCUMENTS

| | | | |
|---|---|---|---|
| 3,829,647 A * | 8/1974 | Cleaveland | H01B 7/426 |
| | | | 165/182 |
| 3,879,100 A * | 4/1975 | Chabot | H01H 71/08 |
| | | | 165/182 |
| 3,909,097 A * | 9/1975 | Roth | H01H 71/082 |
| | | | 335/8 |
| 4,492,941 A * | 1/1985 | Nagel | H01H 71/08 |
| | | | 335/13 |
| 6,317,018 B1 * | 11/2001 | Castonguay | H01H 71/1009 |
| | | | 335/10 |
| 6,491,544 B1 | 12/2002 | Lias et al. | |
| 6,565,394 B2 | 5/2003 | Seff et al. | |
| 6,589,070 B1 | 7/2003 | Lias et al. | |
| 6,589,071 B1 | 7/2003 | Lias et al. | |
| 6,612,865 B2 | 9/2003 | Lias et al. | |
| 6,612,878 B2 | 9/2003 | Lias et al. | |
| 6,614,334 B1 * | 9/2003 | Gibson | H01H 71/1045 |
| | | | 335/132 |
| 6,692,296 B2 | 2/2004 | Lias et al. | |
| 2004/0056631 A1 * | 3/2004 | Derksen | H05K 7/209 |
| | | | 318/727 |
| 2004/0155645 A1 * | 8/2004 | Dragoi | G01R 1/203 |
| | | | 324/126 |
| 2004/0163349 A1 * | 8/2004 | Gerep | F24H 9/0026 |
| | | | 52/506.02 |
| 2004/0188080 A1 * | 9/2004 | Gailus | F28F 13/00 |
| | | | 165/185 |
| 2010/0282713 A1 * | 11/2010 | Tu | H01H 33/6606 |
| | | | 218/118 |
| 2013/0020055 A1 * | 1/2013 | Wu | B23P 15/26 |
| | | | 165/104.26 |
| 2013/0210269 A1 * | 8/2013 | Neer | G02B 6/4246 |
| | | | 439/487 |
| 2013/0213780 A1 * | 8/2013 | Kolberg | H01H 9/52 |
| | | | 200/284 |
| 2015/0371790 A1 * | 12/2015 | Sippel | H01H 1/62 |
| | | | 200/284 |

* cited by examiner

ELECTRICAL SWITCHING APPARATUS, AND JUMPER AND ASSOCIATED METHOD THEREFOR

BACKGROUND

Field

The disclosed concept relates generally to electrical switching apparatus and, more particularly, to circuit interrupters, such as, for example, circuit breakers. The disclosed concept also relates to jumpers for electrical switching apparatus. The disclosed concept further relates to methods of making jumpers.

Background Information

Circuit breakers are typically available in one-, two-, three- and four-pole construction, although larger counts of poles are possible. It is known to connect multiple poles of circuit breakers in series to provide a high voltage for a low voltage switching and interruption device (e.g., without limitation, 750 VDC; 1000 VDC; 1500 VAC). For a 1000 VDC application, for example, typically multiple circuit breakers are electrically tied together. Most known existing six-pole or eight-pole air circuit breakers are designed such that the poles are electrically connected internally in breaker structures in a predetermined manner.

It is known that to obtain higher interruption and voltage ratings, circuit breaker poles can be wired in series. Normally, cable or bus bars are electrically connected to the circuit breaker terminals, which carry the current and remove a significant amount of the heat that is generated within the breaker. A conventional shorting strap, commonly referred to as a jumper, electrically connected between poles can carry the current, but does not remove much heat, resulting in relatively high temperature rises at the circuit breaker terminals. Commonly assigned United States Patent Application Publication No. 2013/0213780 discloses an example jumper for electrically connecting electrical switching apparatus poles.

Consumer markets demand a circuit breaker jumper that both occupies relatively little space and operates at relatively low temperatures. The conventional tradeoff in jumper design, however, is between size and thermal performance (e.g., heat transfer). That is, to achieve lower operating temperatures, typically the size of the jumper must increase, and vice versa. Stated another way, jumper designs must generally concede in one of these areas, or otherwise be cost-prohibitive.

There is room, therefore, for improvement in electrical switching apparatus, such as circuit breakers, and in jumpers and associated methods therefor.

SUMMARY

These needs and others are met by embodiments of the disclosed concept, direct to a jumper and associated method for electrical switching apparatus, which among other benefits, provide both a current carrying function and a heat transfer function within a relatively small available space.

In accordance with one aspect of the disclosed concept, a jumper is provided for an electrical switching apparatus. The electrical switching apparatus comprises a plurality of poles. Each of the poles comprises a terminal. The terminal of a first one of the poles is proximate the terminal of a second one of the poles. The jumper comprises: a jumper member comprising an attachment portion and a heat sink portion, the attachment portion being structured to electrically connect the terminal of the first one of the poles to the terminal of the second one of the poles, the heat sink portion comprising a plurality of spaced apart heat transfer members. The plurality of spaced apart heat transfer members are arranged in a plurality of rows and a plurality of columns.

The jumper member may further comprise a first side, a second side disposed opposite the first side, a first end, a second end disposed opposite the first end, a first edge, and a second edge disposed opposite the first edge. The attachment portion may include a first leg extending outwardly from the first end and a second leg extending outwardly from the first end opposite and spaced from the first leg. The plurality of rows and the plurality of columns may extend outwardly from the first side between the first edge and the second edge. Each of the heat transfer members may have a width, a height and a depth. The width may be the same for all of the heat transfer members, the height may be the same for all of the heat transfer members, and the depth may be the same for all of the heat transfer members. Each one of the rows may be spaced apart the same distance from the other rows. Each one of the columns may be spaced apart the same distance from the other columns.

As another aspect of the disclosed concept, an electrical switching apparatus comprises: a plurality of poles each comprising a terminal, the terminal of a first one of the poles being proximate the terminal of a second one of the poles; and at least one jumper comprising: a jumper member comprising an attachment portion and a heat sink portion, the attachment portion electrically connecting the terminal of the first one of the poles to the terminal of the second one of the poles, the heat sink portion comprising a plurality of spaced apart heat transfer members. The plurality of spaced apart heat transfer members are arranged in a plurality of rows and a plurality of columns.

The electrical switching apparatus may be a circuit breaker including a plurality of jumpers. Each of the jumpers may electrically connect the terminals of a pair of the poles of the circuit breaker.

As a further aspect of the disclosed concept, a method of making a jumper comprises: extruding a jumper member from a single piece of electrically and thermally conductive material; and machining the jumper member to form an attachment portion and a heat sink portion comprising a plurality of spaced apart heat transfer members arranged in a plurality of rows and a plurality of columns.

The method may further comprise drilling and threading the attachment portion. The method may also comprise coating a plurality of surfaces with an electrically insulating material.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

It will be appreciated that although the disclosed concept is shown and described in the examples herein in association with a four-pole circuit breaker, the disclosed concept is applicable to a wide range of electrical switching apparatus having any known or suitable plurality of poles.

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

As employed herein, the term "fastener" refers to any suitable connecting or tightening mechanism expressly including, but not limited to, screws, bolts and the combinations of bolts and nuts (e.g., without limitation, lock nuts) and bolts, washers and nuts.

As employed herein, the term "number" shall mean one or an integer greater than one (i.e., a plurality).

EXAMPLE 1

Figure 1:
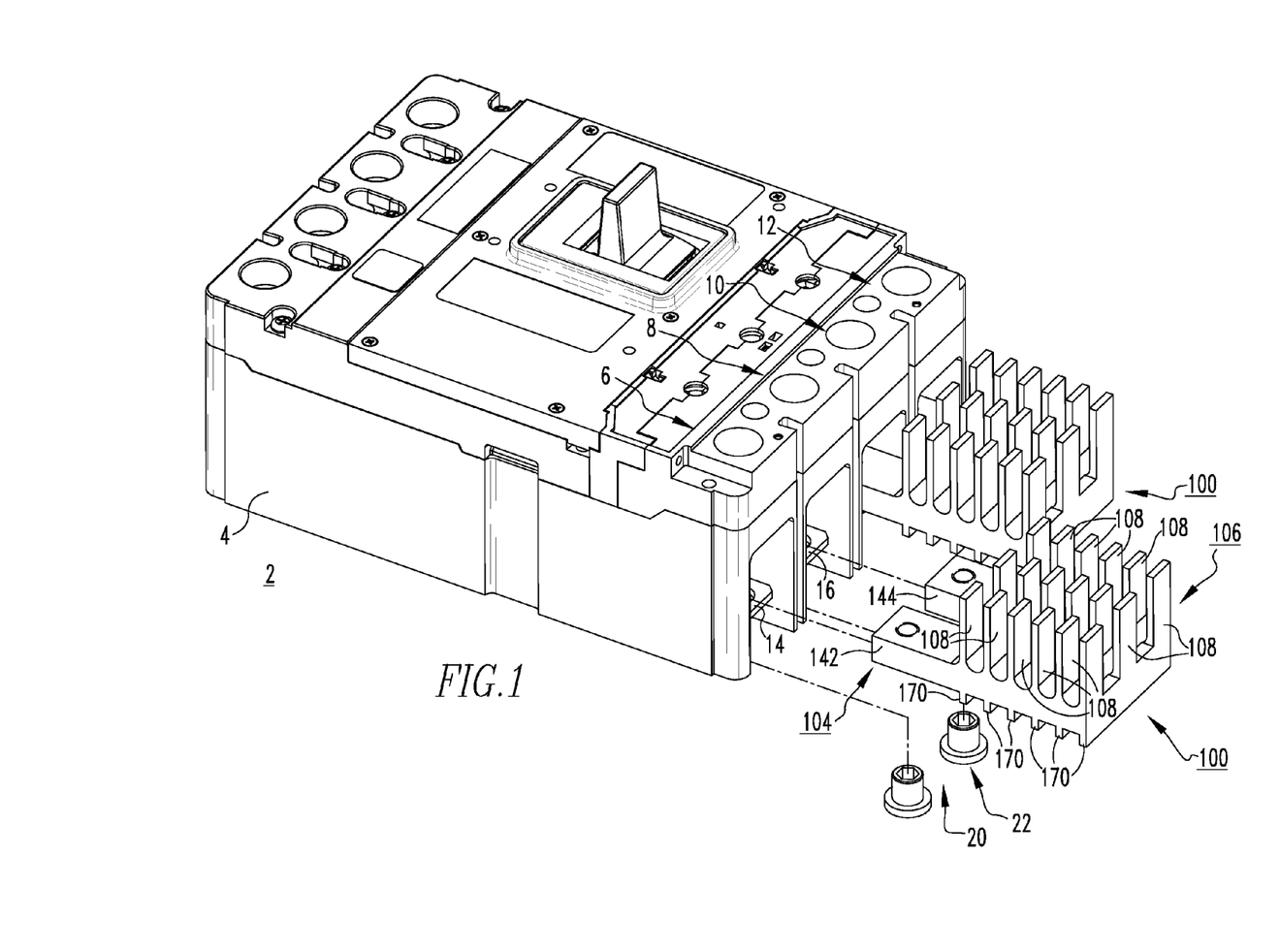
FIG. 1 is an isometric partially exploded view of a circuit breaker and jumpers therefor, in accordance with an embodiment of the disclosed concept.

FIG. 1 shows an electrical switching apparatus 2 (e.g., without limitation, circuit breaker including a housing 4 and a plurality of poles 6,8,10,12 (four are shown) employing a pair of jumpers 100, in accordance with a non-limiting embodiment of the disclosed concept. The jumper 100 is for electrical connection between a terminal 14 of one circuit breaker pole 6 and a terminal 16 of another circuit breaker pole 8.

In the example shown, the jumpers 100 are designed to be bolted to the circuit breaker terminals 14,16. Portions (see, for example and without limitation, legs 142 and 144 of attachment portion 104, described hereinbelow) may be threaded to further facilitate mechanically coupling and electrically connecting the jumpers 100 to the corresponding terminals 14,16.

Figure 6:
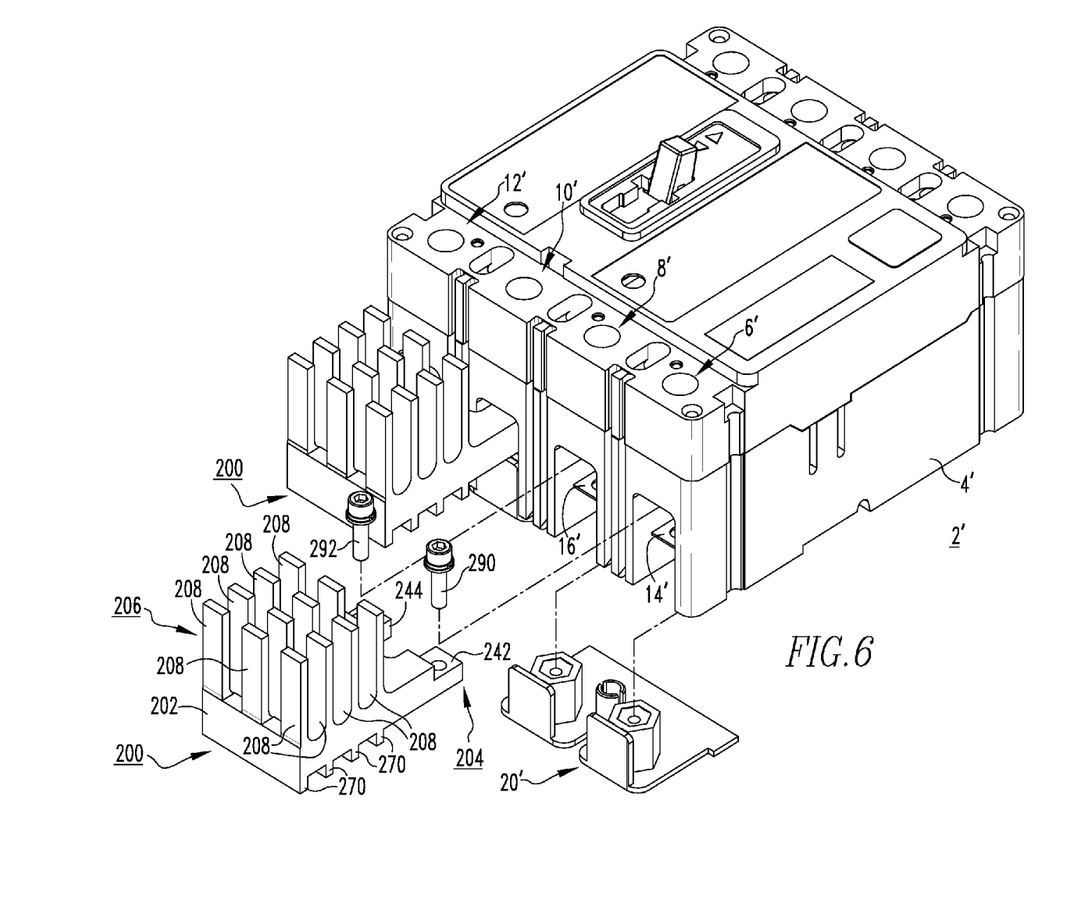
FIG. 6 is an isometric partially exploded view of a circuit breaker and jumpers therefor, in accordance with another embodiment of the disclosed concept.
Figure 7:
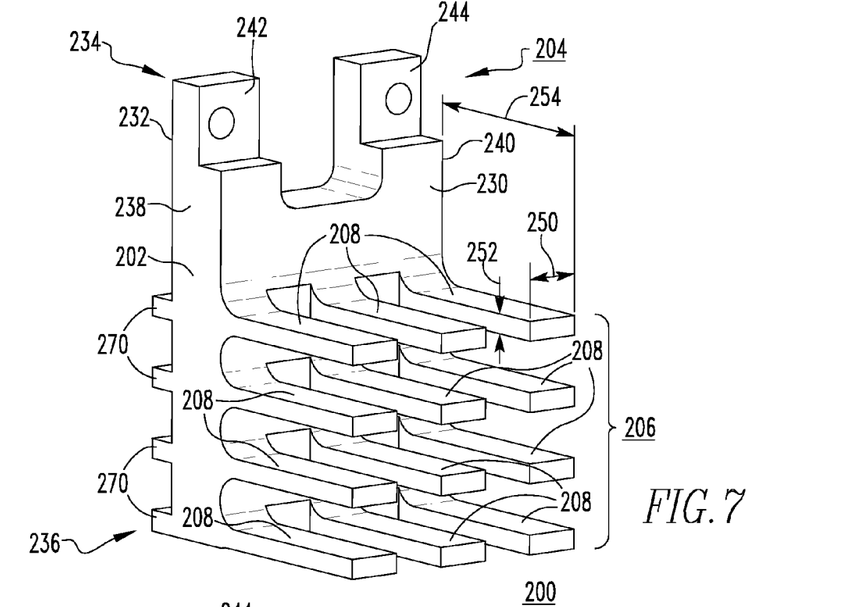
FIGS. 7 and 8 are front and back isometric views, respectively, of one of the jumpers of FIG. 6.

In FIG. 1, the poles 6,8 further include a number of connection members 20,22 (two are shown), which preferably cooperate with a corresponding number of suitable fasteners (not shown, but see fasteners 290 and 292 cooperating with connection member 20' of FIG. 6).

It will be appreciated that, for ease of illustration and economy of disclosure, only one jumper 100 will be described in detail herein.

EXAMPLE 2

Figure 2:
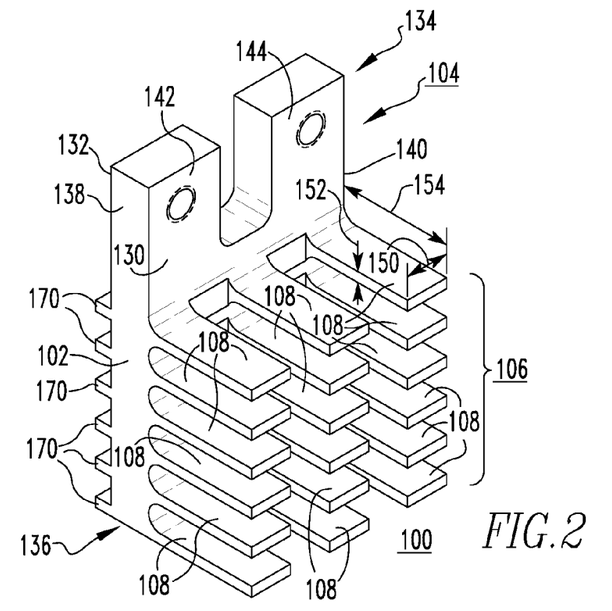
FIGS. 2 and 3 are front and back isometric views, respectively, of one of the jumpers of FIG. 1.
Figure 3:
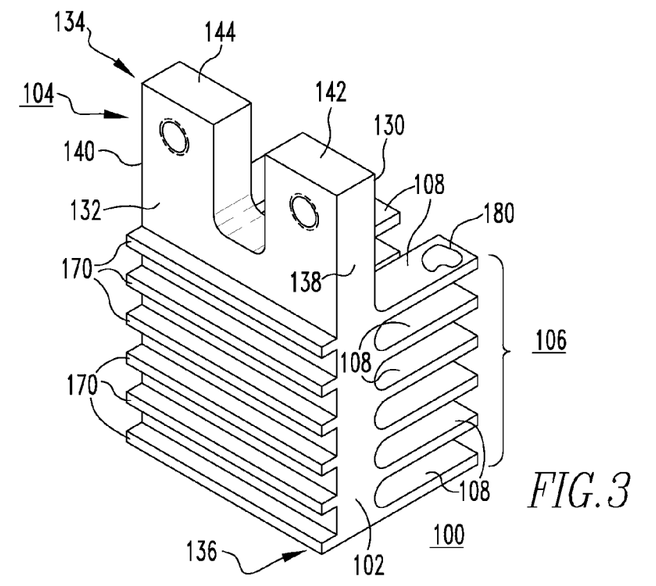
Figure 4:
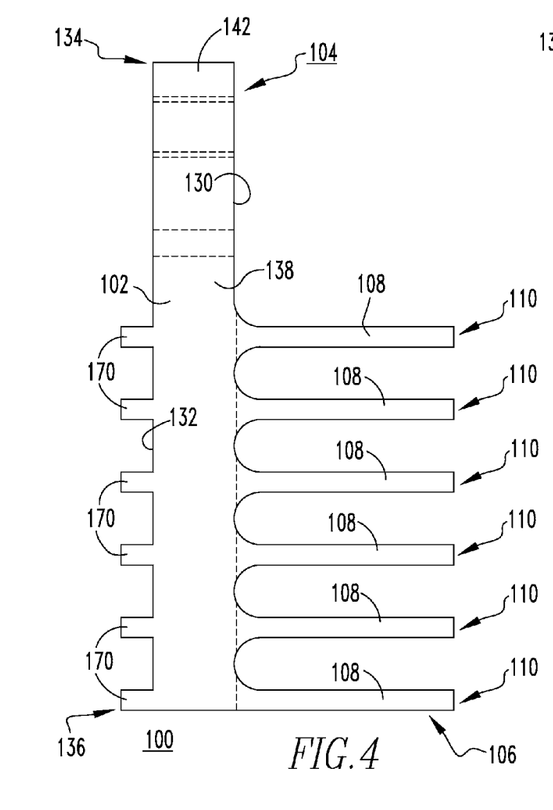
FIGS. 4 and 5 are side elevation and top plan views, respectively, of the jumper of FIGS. 2 and 3.

Referring to FIGS. 2-4, the jumper 100 includes a jumper member 102 having an attachment portion 104 and a heat sink portion 106. The attachment portion 104 is structured to electrically connect the terminal 14 of a corresponding first one of the circuit breaker poles 6 to the terminal 16 of another one of the circuit breaker poles 8, as previously discussed hereinabove with respect to FIG. 1. The heat sink portion 106 includes a plurality of spaced apart heat transfer members 108. More specifically, all of the heat transfer members 108 are spaced apart from one another. The heat transfer members 108 are arranged in a plurality of rows 110 and a plurality of columns 120, as best shown in FIGS. 4 and 5.

In other words, the heat transfer members 108 preferably comprise a plurality of spaced apart pin fins. Among other advantages, such a design allows for a more omni-directional method to dissipate heat. That is, conventional jumper designs (not shown) employ a plurality of elongated fins that extend in one direction the entire width of the jumper parallel to and spaced from one another. Such conventional elongated fins only work effectively if they are positioned (e.g., aligned) such that the air is free to move in the exact direction in which the fins are oriented. In other words, a variety of different jumper designs must be created in which the elongated fins are disposed in different horizontal or vertical positions, depending on whether the circuit breaker is to be mounted horizontally or vertically. The "pin fin" concept of the disclosed jumper 2 addresses and overcomes this disadvantage by allowing free flow of air in multiple directions around and through the spaced apart rows 110 and columns 120 of heat transfer members 108 (e.g., without limitation, pin fins). Thus, a single jumper design can be employed for a variety of different circuit breaker mounting configurations.

EXAMPLE 3

Figure 5:
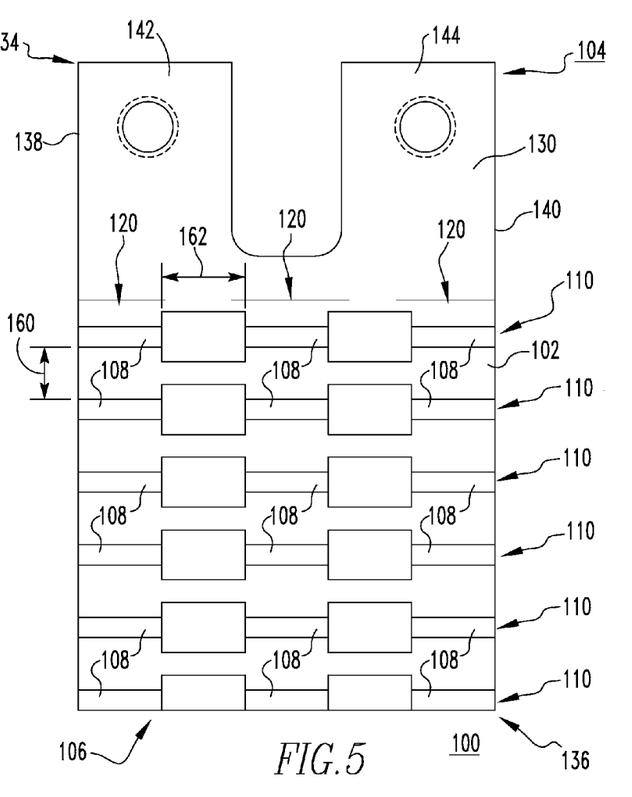

Continuing to refer to FIGS. 2-5, the jumper member 102 of jumper 100 further includes first and second opposing sides 130,132, first and second opposing ends 134,136, and first and second opposing edges 138,140. The attachment portion 104 includes a first leg 142 extending outwardly from the first end 134, and a second leg 144 also extending outwardly from the first end 134 opposite and spaced from the first leg 142, as shown in FIGS. 2, 3 and 5. The plurality of rows 110 and the plurality of columns 120 (both shown in FIG. 5) extend outwardly from the first side 130 between the first and second edges 138,140, as best shown in FIG. 5.

EXAMPLE 4

The heat sink portion 106 of the jumper member 102 of the jumper 100 preferably includes at least three rows 110 of heat transfer members 108 and at least three columns 120 of heat transfer members 108.

EXAMPLE 5

In the non-limiting example embodiment of FIGS. 1-5, the jumper member 102 includes six rows 110 of heat transfer members 108 and three columns 120 of heat transfer members 108.

EXAMPLE 6

Figure 10:
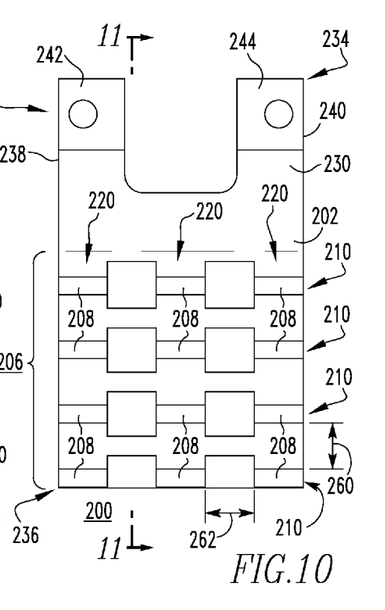
Figure 11:
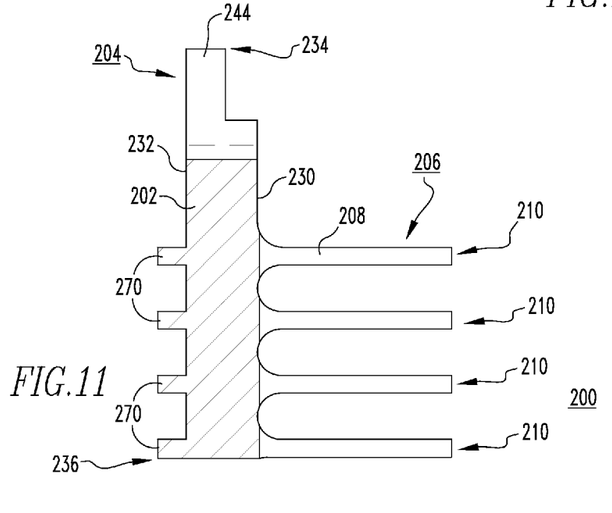
FIG. 11 is a section view taken along line 11-11 f FIG. 10.

Preferably each one of the rows 110 is spaced apart the same distance 160 from the other rows 110, as best shown in FIG. 5. See also rows 210 of jumper member 202, which are equally spaced a distance 260, as shown in FIG. 10, and jumper member 302 of FIGS. 12-15 wherein the rows 310 of heat transfer members 308 are equally spaced a distance 360 (FIG. 13).

EXAMPLE 7

Preferably each one of the columns 120 is spaced apart the same distance 162 from the other columns 120, as best shown in FIG. 5. See also columns 220 of jumper member 202 of FIGS. 6-11, which are equally spaced a distance 262 (FIG. 10), and columns 320 of jumper member 302 of FIGS. 12-15, which are equally spaced a distance 362 (FIG. 13).

EXAMPLE 8

Referring to FIG. 2, each of the heat transfer members 108 has a width 150, a height 152 and a depth 154. The width 150 is preferably the same for all of the heat transfer members 108, the height 152 is preferably the same for all of the heat transfer members 108, the depth 154 is preferably the same for all of the heat transfer member 108.

EXAMPLE 9

As best shown in FIG. 3, the heat sink portion 106 of the jumper member 102 preferably further includes a plurality of elongated fins 170, which extend outwardly from the second side 132 of the jumper member 102, as shown. Each of the elongated fins 170 preferably extends from the first edge 138 of the jumper member to the second edge 140 of the jumper member.

EXAMPLE 10

The jumper 100 (FIGS. 1-5), 200 (FIGS. 6-11), 300 (FIGS. 12-15) preferably comprises a jumper member 102 (FIGS. 1-5), 202 (FIGS. 6-11), 302 (FIGS. 12-15) made from a single piece of electrically and thermally conductive material.

EXAMPLE 11

In one non-limiting embodiment, the jumper members (e.g., 102,202,302) are made from copper or aluminum (e.g., without limitation, 6063-T6 aluminum).

EXAMPLE 12

Preferably, the jumper members (e.g., 102,202,302) are extruded from a single piece of such electrically and thermally conductive material, and are machined (e.g., without limitation, cross-hatch machined) to form the aforementioned heat sink members 108 (FIGS. 1-5), 208 (FIGS. 6-11), 308 (FIGS. 12-15) of the heat sink portions 106 (FIGS. 1-5), 206 (FIGS. 6-11), 306 (FIGS. 12-15) and attachment portions 104 (FIGS. 1-5), 204 (FIGS. 6-11), 304 (FIGS. 12-15). That is, the jumper members (e.g., 102,202, 302) are preferably extruded, cut, drilled and/or threaded, as necessary to provide a single piece electrically and thermally conductive member that both performs well thermally and maintains a small overall size, thereby satisfying market requirements regarding size, performance and cost.

EXAMPLE 13

Figure 8:
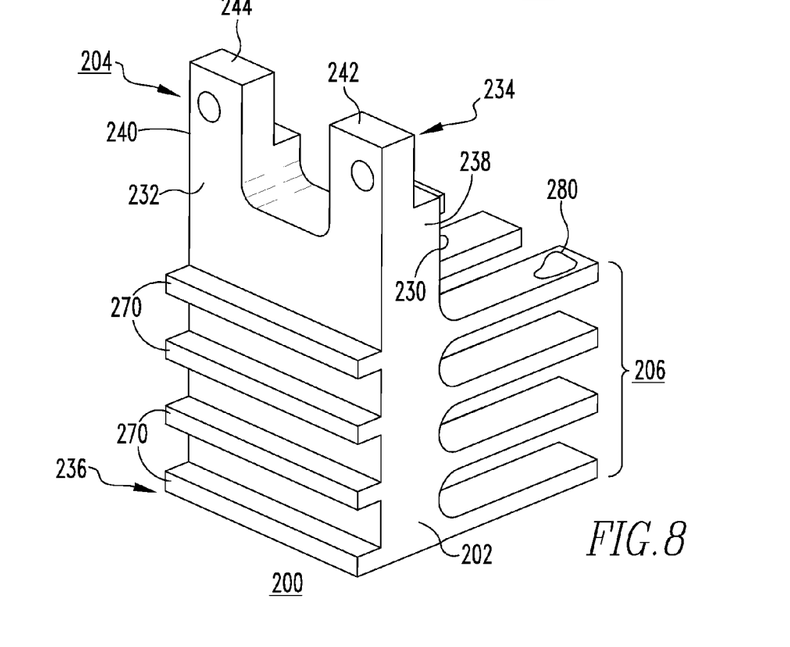
Figure 9:
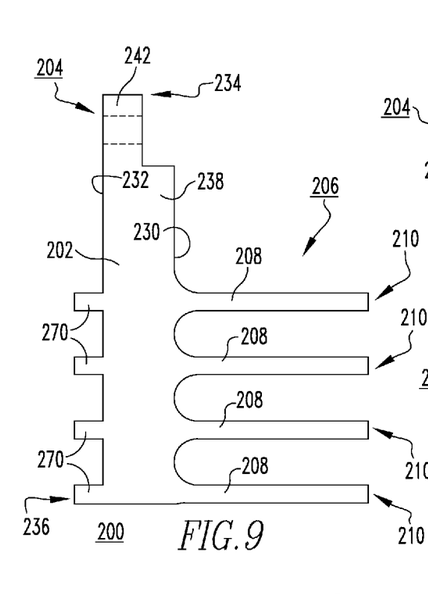
FIGS. 9 and 10 are side elevation and top plan views, respectively, of the jumper of FIGS. 7 and 8.
Figure 12:
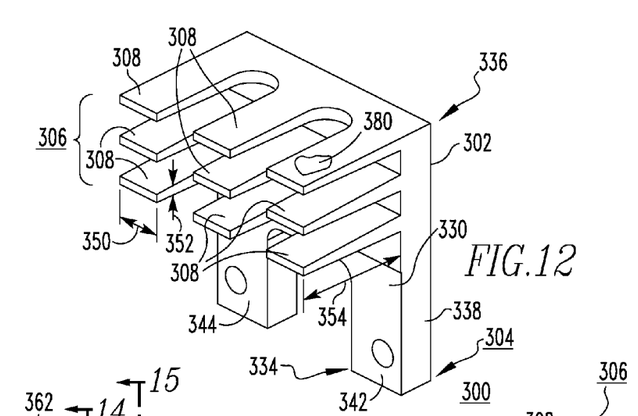
FIG. 12 is an isometric view of a jumper in accordance with another embodiment of the disclosed concept.
Figure 13:
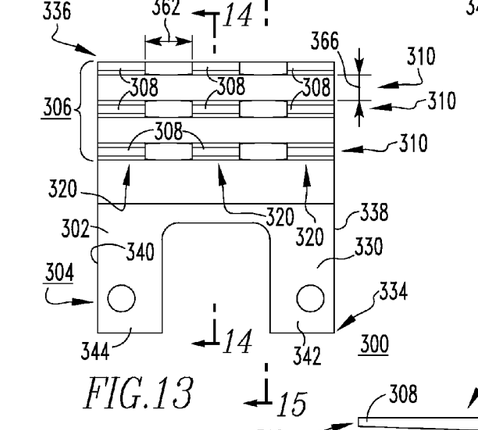
FIG. 13 is a top plan view of the jumper of FIG. 12.
Figure 14:
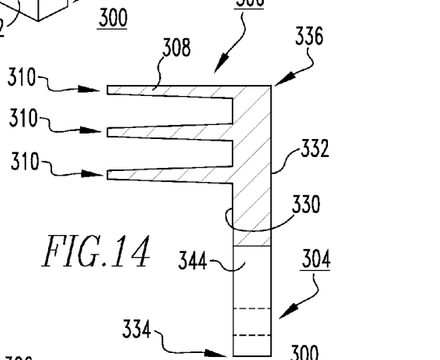
FIG. 14 is a section view taken along line 14-14 of FIG. 13.
Figure 15:
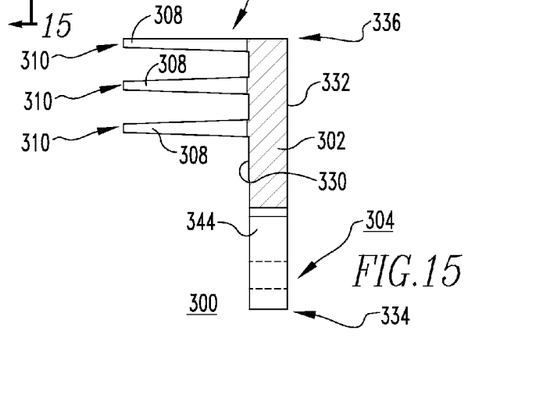
FIG. 15 is a section view taken along line 15-15 of FIG. 13.

The jumper member 102,202,302 preferably further includes a plurality of surfaces coated with an electrically insulating material 180,280,380, as partially shown in simplified form in FIGS. 3, 8 and 12, respectively. For example and without limitation, such portions can be painted black for enhanced thermal performance.

EXAMPLE 14

FIGS. 6 and 7-11 show another circuit breaker 2' and jumpers 200 (two are shown) therefor, in accordance with another non-limiting alternative example embodiment of the disclosed concept. The circuit breaker 2' includes a housing 4' and four poles 6',8',10',12'. Each pole 6',8' includes a corresponding terminal 14',16'.

Jumper 200 electrically connects terminal 14' of circuit breaker pole 6' to terminal 16' of circuit breaker pole 8'. More specifically, a fastener 290 extends through leg 242 of extension portion 204 through terminal 14' and threads into the corresponding portion of connection member 20'. Similarly, fastener 292 extends through terminal 16' and leg 244 of the attachment portion 204 to threadingly engage another corresponding portion of the connection member 20'. In this manner, the jumper 200 is mechanically coupled securely to the terminals 14',16' of the circuit breaker 2'.

EXAMPLE 15

Continuing to refer to FIGS. 6-11, the jumper 200 may employ a jumper member 202 having a heat sink portion 206 with four rows 210 and three columns 220 of heat transfer members 208, as shown.

The width 250, height 252 and depth 254 of each of the heat transfer members 208 (e.g., without limitation, pin fins) may be the same for all of the heat transfer members 208.

The jumper member 202 may include a plurality of elongated fins 270 extending outwardly from the second side 232 of the jumper member 202 between the first and second edges 238,232, as best shown in FIG. 8.

EXAMPLE 16

FIGS. 12-15 show another jumper 300 in accordance with a further non-limiting alternative example embodiment in accordance with the disclosed concept. The jumper member 302 of FIGS. 12-15 includes three rows 310 and three columns 320 of heat transfer members 308 (e.g., without limitation, pin fins).

As shown in FIG. 12, each of heat transfer members 308 has a width 350, a height 352, and a depth 354. In the example shown, the dimensions of these parameters are the same for six of the heat transfer members 308. However, the height 352 of the other three heat transfer members 308 (see, for example, the last row 310 of heat transfer members 308 disposed at the second end 336) is different. More specifically, whereas the other six heat transfer members 308 have a height 352 (e.g., thickness) that varies (e.g., tapers), the last row 310 of heat sink members 308, disposed at the second end 336 of the jumper member 302, all have a constant (e.g., non-tapering) height 352 (e.g., thickness). This will be further appreciated with reference to the section views of FIGS. 14 and 15.

It will also be appreciated that, unlike the aforementioned jumper members 102 (FIGS. 1-5) and 202 (FIGS. 6-11), in the example embodiment of FIGS. 12-15, the second side 332 of the jumper member 302 does not include any elongated fins.

It will be appreciated that the jumpers 100,200,300 could have any known or suitable alternative configuration (not shown) consisting of a plurality of rows 110,210,310 and columns 120,220,320 of spaced apart heat transfer members 108,208,308 (e.g., without limitation, pin fins), in order to provide a jumper 100,200,300 with enhanced thermal performance (e.g., heat transfer) while maintaining a small overall size. In this manner, a single, relatively low cost jumper 100,200,300 can be made and employed in a wide variety of different electrical switching apparatus applications (e.g., without limitation, horizontally and/or vertically mounted circuit breakers 2,2'). The spaced apart rows 110, 210,310 and columns 120,220,320 of heat transfer members 108,208,308 establish effective airflow and, therefore, heat dissipation. This, in combination with the single piece electrically and thermally conductive material (e.g., without limitation, copper; aluminum) construction of the jumper 100,200,300 provide for an effective yet relatively small and inexpensive design.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A jumper for an electrical switching apparatus, said electrical switching apparatus comprising a plurality of poles, each of said poles comprising a terminal, the terminal of a first one of said poles being proximate the terminal of a second one of said poles, said jumper comprising:
    a jumper member comprising an attachment portion, a heat sink portion, a first side, a second side disposed opposite the first side, a first edge extending from proximate the attachment portion, and a second edge disposed opposite the first edge and extending from proximate the attachment portion, said attachment portion being structured to electrically connect the terminal of the first one of said poles to the terminal of the second one of said poles, said heat sink portion comprising a plurality of spaced apart heat transfer members,
    wherein said plurality of spaced apart heat transfer members are arranged in a plurality of rows and a plurality of columns,
    wherein said plurality of rows and said plurality of columns extend outwardly from the first side between the first edge and the second edge,
    wherein each of said heat transfer members has a width and a height,
    wherein the width is greater than the height,
    wherein said jumper member further comprises a plurality of elongated fins extending outwardly from the second side, and
    wherein each of said elongated fins extends from the first edge to the second edge.

2. The jumper of claim 1 wherein said jumper member further comprises a first end and a second end disposed opposite the first end; and wherein said attachment portion includes a first leg extending outwardly from the first end and a second leg extending outwardly from the first end opposite and spaced from the first leg.

3. The jumper of claim 2 wherein each of said heat transfer members further includes a depth; wherein the width is the same for all of said heat transfer members; wherein the height is the same for all of said heat transfer members; and wherein the depth is the same for all of said heat transfer members.

4. The jumper of claim 2 wherein said plurality of rows is at least three rows; and wherein said plurality of columns is at least three columns.

5. The jumper of claim 4 wherein each one of said rows is spaced apart the same distance from the other rows; and wherein each one of said columns is spaced apart the same distance from the other columns.

6. A method of making a jumper comprising:
    extruding a jumper member from a single piece of electrically and thermally conductive material; and
    machining the jumper member to form an attachment portion and a heat sink portion comprising a plurality of spaced apart heat transfer members arranged in a plurality of rows and a plurality of columns, each of said heat transfer members having a width and a height,
    wherein said plurality of rows and said plurality of columns extend outwardly from a first side of said jumper member between a first edge of said jumper member and a second edge of said jumper member,
    wherein the width of said heat transfer members is greater than the height,
    wherein said jumper member further comprises a plurality of elongated fins extending outwardly from a second side of said jumper member disposed opposite the first side,
    wherein each of said elongated fins extends from the first edge to the second edge, and
    wherein the first edge and the second edge each extend from proximate the attachment portion.

7. The jumper of claim 1 wherein said jumper member is a single piece of electrically and thermally conductive material.

8. The jumper of claim 1 wherein said jumper member further comprises a plurality of surfaces coated with an electrically insulating material thereon.

9. An electrical switching apparatus comprising:
    a plurality of poles each comprising a terminal, the terminal of a first one of said poles being proximate the terminal of a second one of said poles; and
    at least one jumper comprising:
        a jumper member comprising an attachment portion, a heat sink portion, a first side, a second side disposed opposite the first side, a first edge extending from proximate the attachment portion, and a second edge disposed opposite the first edge and extending from proximate the attachment portion, said attachment portion electrically connecting the terminal of the first one of said poles to the terminal of the second one of said poles, said heat sink portion comprising a plurality of spaced apart heat transfer members,
        wherein said plurality of spaced apart heat transfer members are arranged in a plurality of rows and a plurality of columns,
        wherein said plurality of rows and said plurality of columns extend outwardly from the first side between the first edge and the second edge,
        wherein each of said heat transfer members has a width and a height,
        wherein the width is greater than the height,
        wherein said jumper member further comprises a plurality of elongated fins extending outwardly from the second side, and
        wherein each of said elongated fins extends from the first edge to the second edge.

10. The electrical switching apparatus of claim 9 wherein said jumper member further comprises a first end and a second end disposed opposite the first end; and wherein said attachment portion includes a first leg extending outwardly from the first end and a second leg extending outwardly from the first end opposite and spaced from the first leg.

11. The electrical switching apparatus of claim 10 wherein each of said heat transfer members further includes a depth; wherein the width is the same for all of said heat transfer members; wherein the height is the same for all of said heat transfer members; and wherein the depth is the same for all of said heat transfer members.

12. The electrical switching apparatus of claim 10 wherein each one of said rows is spaced apart the same distance from the other rows; and wherein each one of said columns is spaced apart the same distance from the other columns.

13. The method of claim 6, further comprising drilling and threading said attachment portion.

14. The electrical switching apparatus of claim 9 wherein said jumper member is a single piece of electrically and thermally conductive material.

15. The electrical switching apparatus of claim 9 wherein said jumper member further comprises a plurality of surfaces coated with an electrically insulating material thereon.

16. The electrical switching apparatus of claim 9 wherein said poles further comprise a number of connection members; wherein said at least one jumper further comprises a number of fasteners; and wherein each of said fasteners fastens a portion of said attachment portion to a corresponding one of said connection members.

17. The electrical switching apparatus of claim 9 wherein said electrical switching apparatus is a circuit breaker; wherein said at least one jumper is a plurality of jumpers; and wherein each of said plurality of jumpers electrically connects the terminals of a pair of said poles of said circuit breaker.

18. The method of claim 6 further comprising coating a plurality of surfaces with an electrically insulating material.

* * * * *